United States Patent [19]

Lindsey et al.

[11] Patent Number: 4,719,632
[45] Date of Patent: Jan. 12, 1988

[54] SINGLE CONTACT TAILORED GAIN CHIRPED ARRAYS OF DIODE LASERS FOR SUPERMODE CONTROL WITH SINGLE-LOBED FARFIELD PATTERNS

[75] Inventors: Christopher P. Lindsey, Pasadena, Calif.; Elyahou Kapon, Aberdeen, N.J.; Joseph Katz, Pasadena; Shlomo Margalit, S. Pasadena, both of Calif.; Amnon Yariv, San Marino, Calif.

[73] Assignee: California Institute of Technology, Pasadena, Calif.

[21] Appl. No.: 746,995

[22] Filed: Jun. 19, 1985

[51] Int. Cl.$^4$ .............................................. H01S 3/19
[52] U.S. Cl. ...................................... 372/50; 372/45; 372/46
[58] Field of Search ...................... 372/50, 45, 44, 46

[56] References Cited

U.S. PATENT DOCUMENTS 4,594,719  6/1986  Ackley ................................. 372/50

OTHER PUBLICATIONS

"Phase-Locked Injection Laser Arrays with Non-Uniform Stripe Spacing," by D. E. Ackley, Ninth IEEE International Semiconductor Laser Conference, Rio-Sheraton Hotel, Rio de Janeiro, Brazil, Aug. 7-10, 1984, pp. 88-89.
"Phase-Locked Injection Laser Arrays with Variable Stripe Spacing," by Donald E. Ackley, et al., IEEE Journal of Quantum Electronics, vol. QE-22, No. 12, Dec. 1986, pp. 2204-2212.
"Chirped Arrays of Phase-Locked Semiconductor Lasers," by E. Kapon, et al., Seventh Topical Meeting on Integrated and Guided-Wave Optics, Post Deadline Papers, Orlando Hyatt Hotel, Kissimmee, Florida, Apr. 24-26, 1984, pp. PD-1- to PD-1-4.

Primary Examiner—James W. Davie
Attorney, Agent, or Firm—Freilich, Hornbaker, Rosen & Fernandez

[57] ABSTRACT

An array of nonuniform semiconductor diode lasers with supermode control for achieving a single-lobed farfield pattern is described. This is accomplished by spatially segregating the fundamental supermode from the other supermodes, tailoring the spatial gain profile as as to favor the fundamental supermode, and sufficiently increasing the intechannel coupling so as to bring about single-lobed farfield operation. In a preferred embodiment, this is achieved in a shallowly proton implanted, tailored gain, chirped laser array in which the widths of the lasers are varied linearly across the array.

12 Claims, 11 Drawing Figures

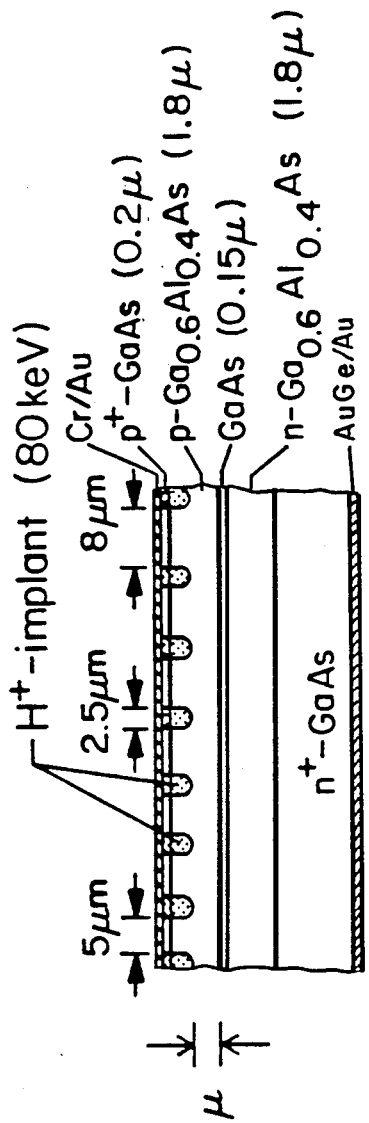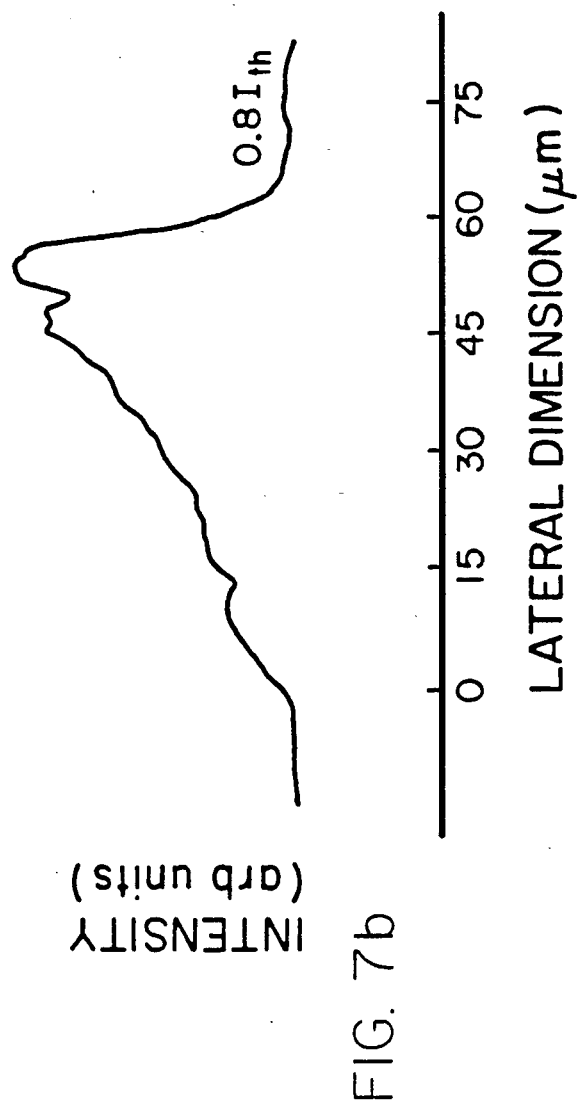
FIG. 7a
FIG. 7b

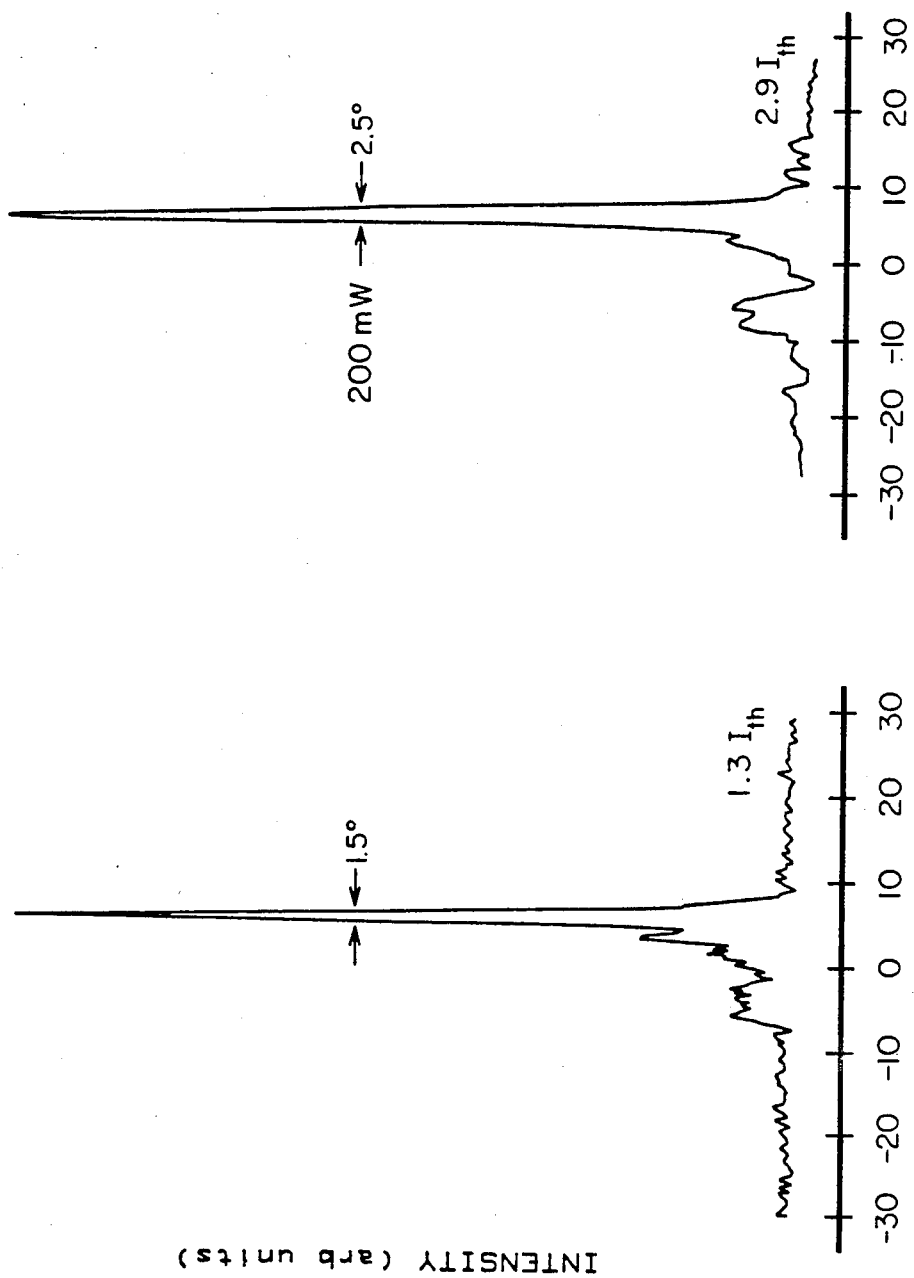

SINGLE CONTACT TAILORED GAIN CHIRPED ARRAYS OF DIODE LASERS FOR SUPERMODE CONTROL WITH SINGLE-LOBED FARFIELD PATTERNS

ORIGIN OF INVENTION

The invention described herein was made in the performance of work under contracts with the Office of Naval Research, the Air Force Office of Scientific Research, the National Science Foundation, and the National Areonautics and Space Administration, and is subject to the provisions of Public Law 96-517 (35 USC 202) in which the Contractor has elected to retain title.

BACKGROUND OF INVENTION

This invention relates to semiconductor diode lasers, and more particularly to structures which make it possible to enhace a lateral supermode with a predominately single-lobed farfield pattern, and discriminate efficiently against all other supermodes, and thereby achieve high power, single-lobed farfield operation. In most arrays, this desired supermode with a predominately single-lobed farfield pattern is the "fundamental" supermode.

Conventional semiconductor lasers are capable of emitting several tens of milliwatts of optical power into a single beam ten to twenty degrees wide in the junction plane (the laser arrays described herein have been shown capable of emitting 450 milliwatts of optical power into a single beam only $3\frac{1}{2}°$ wide). Considerable effort has gone into finding methods of increasing the power output and decreasing the beamwidth of a semiconductor laser. In principle, one method by which this might be done is to increase the width of the laser in the lateral direction to make a "broad area" laser. However, broad area lasers have very wide, poorly characterized, and unstable farfield patterns. These undesirable farfield patterns result from two physical effects.

First, the presence of a nonlinear interaction between the carriers and the optical field produces filaments, so-called because a photomicrograph of an operating device exhibits small areas of enhanced optical intensity with a filamentary structure. This interaction effectively forms a small waveguide 3 to 12 $\mu$m wide within the larger waveguide defined by the entire broad area laser. These filaments are unstable, and the complicated motions and interactions of the many filaments in a broad area laser are one cause of the poor beam quality characteristic of these devices. Therefore, if a laser's power output is to be increased by increasing the laser's width, some method of stabilizing the filaments must be found. In conventional semiconductor lasers, this is usually achieved by making the laser's width narrow enough so that only one filament can form.

A second problem which must be overcome comes about because the waveguide in a wide laser can support many optical modes. In most lasers, only the fundamental mode will have a predominately single-lobed farfield pattern. Thus, if a laser's farfield pattern is to be single-lobed and diffraction limited (i.e., as narrow as possible), the fundamental mode must be the only lasing mode. All other modes must be discriminated against. This is usually achieved by making the laser narrow enough so that the waveguide supports only the fundamental mode, making it the sole lasing mode.

Thus, the twin problems of filamentation and lateral mode control may be solved by the simple expedient of limiting the width of the laser, typically 5 to 10 $\mu$m. However, limiting the width of the laser strip also limits the laser's maximum power output and minimum beamwidth. Therefore, new semiconductor laser designs which achieve high power operation by increasing the laser's width must solve both the filamentation and lateral mode control problems.

One promising method of achieving high power operation is to place many semiconductor lasers in close proximity so that their optical fields add coherently. In such phase-locked semiconductor laser arrays the filamentation problem has been solved by confining the filaments within the individual laser channels which comprise the array. However, although the filamentation problem has been solved in an array, the lateral mode problem remains.

As mentioned earlier, a wide laser waveguide will support many optical modes, only one of which (the fundamental) has the desirable property of having a predominately single-lobed farfield pattern. This is also true in an array. If each of the N elemental laser waveguides within the array supports just one lateral optical mode (which is the usual case), coupled mode theory predicts that the entire array will support N "supermodes" (E. Kapon, J. Katz, and A. Yariv, "Supermode analysis of phased-locked array of semiconductor lasers", Opt. Lett. 9, 125-127, April 1984). It is therefore necessary to create an array structure in which the fundamental supermode is the preferred lasing supermode. This will occur if the fundamental supermode has a higher modal gain than all other waveguide supermodes. The modal gain is approximately given by the overlap between the spatial intensity distribution of the supermode and the gain profile within the laser. This means that it is necessary to devise an array structure in which the light intensity of the fundamental supermode is preferentially concentrated in the high gain region of the laser, and the other undesirable supermodes are concentrated in the low gain region of the laser.

Most arrays to date have been *uniform* arrays in which the widths of the laser channels and the spacing (i.e., interchannel thickness) between them are constant across the array. However, these arrays have suffered from undesirable double-lobed farfield patterns. This results from the fact that the fundamental and the highest order supermode have similar intensity nearfield patterns, and because the highest order supermode in a uniform array has a higher modal gain due to the presence of lossy interchannel regions. This is illustrated in FIG. 1, in which the nearfield and farfield patterns of both the fundamental and highest order supermode of a real index guided uniform array are shown by the heavy curves. (A gain-guided uniform array is similar to the real index guided case.) Note that the envelope of the nearfield patterns of both supermodes (which is given by the light dashed curves in FIG. 1) are virtually identical. The two supermodes differ only in that the highest order supermode has nulls in the lossy interchannel regions. This results in the highest order supermode in a uniform array having the highest modal gain, making it the predominate lasing mode, which in turn leads to the commonly observed undesirable twin-lobed farfield patterns of these devices.

OBJECTS AND SUMMARY OF THE INVENTION

An object of this invention is to provide a *nonuniform* semiconductor diode laser array structure capable of high power operation (i.e., more than 50 milliwatts of optical power per mirror facet) in which the "fundamental" lateral supermode is selected and other lateral supermodes are substantially suppressed so that a narrow, single-lobed farfield pattern is achieved.

One method of discriminating in favor of the fundamental supermode is by first chirping the widths of diode laser channels in an array i.e., by introducing a variation into the widths of the laser channels according to some scheme (which is typically linear or quadratic), for spatially sorting the supermodes. This causes the fundamental supermode to be concentrated at one part of the array (such as the center or side), while the other supermodes are increasingly concentrated at the remaining parts of the array (sides or other side). Next, the gain profile across the array must be tailored so as to favor the fundamental supermode. One way in which this may be accomplished is in a portion (or other particle) implanted array by varying the widths of the laser channels, typically from a minimum at one side to a maximum at the other side, or from a minimum at one side to a maximum in the center to a minimum, or from a maximum at one side to a minimum in the center to a maximum. Finally, the interchannel coupling must be sufficiently enhanced so as to achieve the desired single-lobed farfield operation. These three requirements may be met by means of a shallow proton implantation in a single contact tailored gain chirped array. Arrays which satisfy these conditions have been shown capable of emitting up to 450 mW of optical power per mirror into a single-lobed farfield pattern only a few degrees wide.

The novel features which are considered characteristic of this invention are set forth with particularity in the appended claims. The invention will best be understood from the following description when read in connection with the accompanying drawings.

BRIEF DESCRIPTION OF THE DRAWINGS

FIG. 7a shows a schematic diagram of a single contact tailored gain chirped array with strong interchannel coupling. FIG. 7b is a plot of the experimental spontaneous emission pattern just below threshold showing the tailored gain chirped array of FIG. 7a's highly nonuniform lateral gain profile. The absence of well defined laser channels in FIG. 7b is indicative of strong interchannel coupling.

FIG. 9a shows the experimental farfield pattern for the single contact tailored gain chirped array of FIG. 7 with a diffraction limited beam 1.5° wide at 1.3 $I_{th}$. The corresponding theoretical farfield pattern is shown in FIG. 6b. FIG. 9b shows the experimental farfield pattern for a similar higher power device emitting 200 mW of optical power per mirror into a slightly broader single-lobed beam 2.5° wide at 2.9 $I_{th}$.

DESCRIPTION OF PREFERRED EMBODIMENTS

Figure 1:
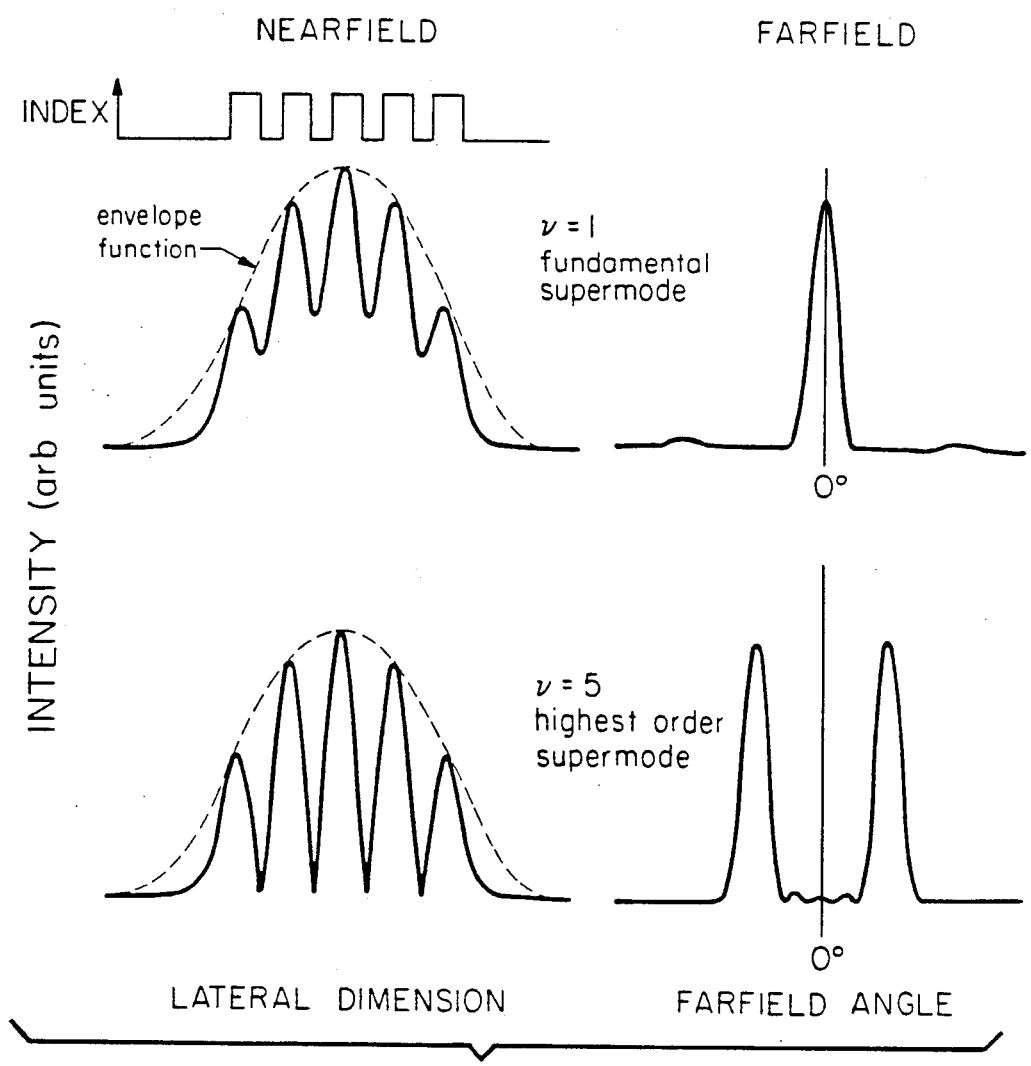
FIG. 1 consists of graphs of the theoretical nearfield and farfield patterns of the fundamental and highest order supermode in a five element, uniform real index guided array. The index in the channels is 3.4149; between and outside the channels it is 3.4118. The channels are on 5 $\mu$m centers, and have widths of 3 $\mu$m, and the interchannel thickness is 2 $\mu$m. The optical wavelength is 0.9 $\mu$m. The supermode patterns for a gain-guided uniform array are essentially similar to the example presented here.

Referring now to the drawings, FIG. 1 shows graphs of the theoretical nearfield and farfield patterns of the fundamental and highest order supermode in a five element uniform real index guided array. The lateral distribution of the effective index in the junction plane was taken, for definiteness, as that corresponding to an array of a typical GaAs/GaAlAs ridge waveguide lasers. The index in the channels is 3.4149; between and outside the channels it is 3.4118. The channels are on 5 $\mu$m centers, and have widths of 3 $\mu$m, and the interchannel thickness is 2 $\mu$m. The optical wavelength is 0.9 $\mu$m. The supermode patterns were calculated by direct numerical solutions of Maxwell's equations. The supermode patterns for a gain-guided uniform array are essentially similar to the example presented here.

The nearfield and farfield patterns of both the fundamental and highest order supermode are shown by the heavy curves in FIG. 1. Note that the envelope of the nearfield patterns of both supermodes (which is given by the light dashed curves in FIG. 1) are vitrually identical. The two supermodes differ only in that the highest order supemode has nulls in the lossy interchannel regions. This results in the highest order supermode in a uniform array having the highest modal gain, which in turn leads to the undesirable twin lobed farfield patterns commonly observed in uniform arrays. (E. Kapon, C. Lindsey, J. Katz, S. Margalit, and A. Yariv, "Chirped arrays of diode lasers for supermode control", Appl. Phys. Lett, 45(3), Aug. 1, 1984.) This illustrates the deficiency of the uniform array structure.

Figure 2:
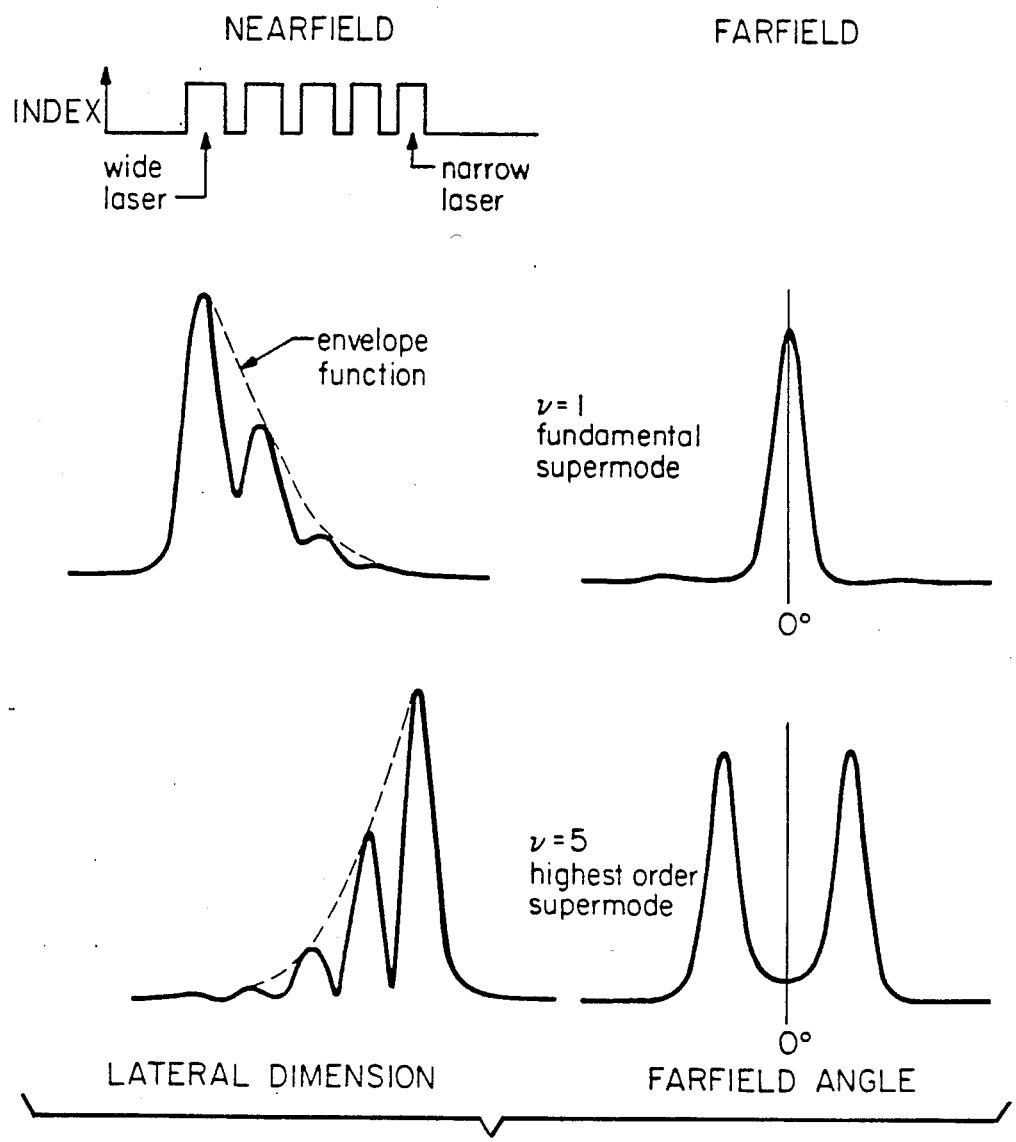
FIG. 2 shows the theoretical nearfield and farfield patterns of both the fundamental and highest order supermode of a *nonuniform* array in which the widths of the laser channels have been linearly chirped (i.e., the widths of the channels increase) from 3 $\mu$m on the right to 5 $\mu$m on the left in steps of 0.5 $\mu$m. All other parameters are the same as those of FIG. 1.

Consider now the *nonuniform* array structure of FIG. 2 which shows the theoretical nearfield and farfield patterns of both the fundamental and highest order supermode of a *nonuniform* array in which the widths of the laser channels have been linearly chirped (i.e., the widths of the channels increase) from 3 $\mu$m on the right to 5 $\mu$m on the left in steps of 0.5 $\mu$m. All other parameter are the same as those of FIG. 1. The envelope of the nearfield patterns of the lowest and highest order supermode (which are, once again, given by the dashed lines) are very different from those of the uniform array of FIG. 1: the fundamental supermode is now strongly concentrated under the leftmost part of the array, while the highest order supermode is now concentrated under the rightmost part of the array. The fundamental supermode may then be selected by tailoring the spatial gain profile so that there is more gain on the left side of the array than there is on the right side.

It should be noted that, for the sake of clarity, the illustrative examples used above referred to theoretical real index guided arrays. In practical real index guided arrays it is not possible to easily simultaneously and independently control both the real part of the refractive index and the gain profile. However, the results and conclusions of the above discussion are equally valid for gain-guided structures in which only the spatial gain profile is controlled. A key feature in implementing the above ideas in an actual device is the recognition that in a *gain-guided* structure the spatial gain profile determines *both* the eigenmodes as well as their modal gains. Thus, both the objectives of (1) spatially differentiating the fundamental supermode from all other supermodes, and (2) insuring that the fundamental supermode has the highest modal gain may be met simultaneously by implementing gain tailoring in a gain-guided semiconductor laser array.

A previously demonstrated method for producing an arbitrary nonuniform gain profile made use of separate contacts in arrays utilizing multilayer metalizations. (J. Katz, E. Kapon, C. Lindsey. S. Margalit, U. Shreter, and A. Yariv, "Phase-Locked Semiconductor Laser Array With Separate Contacts", Appl. Phys. Lett., 43, Sept. 6, 1983.) If dynamic control of the gain profile is not needed, a simple way to tailor the gain profile across a proton implanted array would be to vary the widths of the stripe contacts. (C. P. Lindsey, E. Kapon, J. Katz, S. Margalit, and A. Yariv, "Single contact tailored gain phased-array of semiconductor lasers". Appl. Phys. Lett., 45(7), Oct. 1, 1984.) The lasers under the wider stripes have lower leakage currents, and therefore higher gains than narrower lasers. The gain profile across the array may then be tailored by using contact stripes of different widths. For example, an asymmetric ramped gain profile may be obtained by introducing a linear variation (i.e., a chirp) in the contact widths across the array. In this way the gain profile within an array may be tailored with the use of only a single contact.

Figure 3:
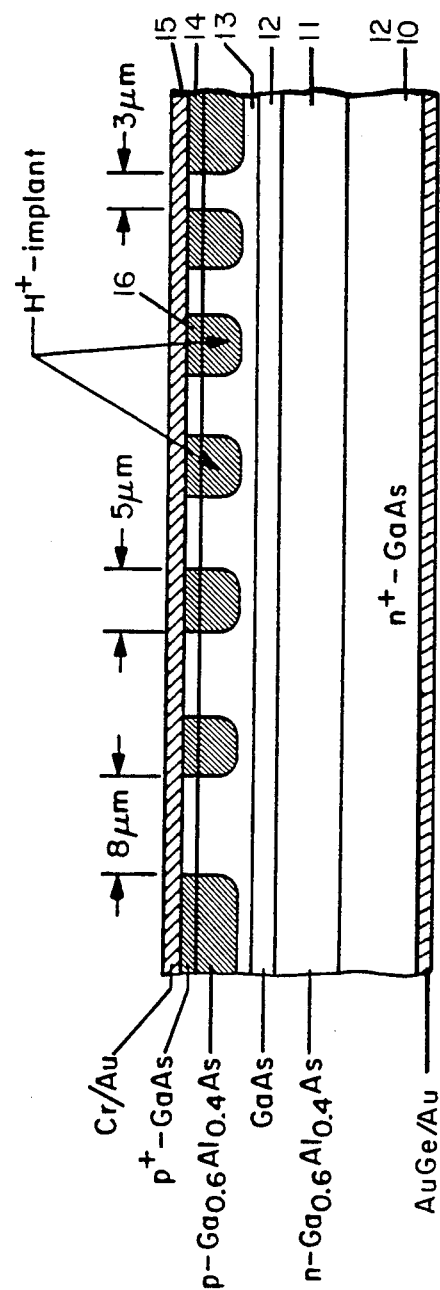
FIG. 3 is a schematic diagram of a six element nonuniform proton implanted array in which the widths of the laser channels vary from 3 $\mu$m to 8 $\mu$m in steps of 1 $\mu$m with 5 $\mu$m between channels. This produces a strongly nonuniform spatial gain distribution across the array.

FIG. 3 is an end-view schematic diagram of such a six element nonuniform gain-guided proton implanted chirped array in which the damage created by the implanted protons creates the high resistivity regions which separate the laser channels. The widths of the laser channels vary from 3 $\mu$m to 8 $\mu$m in steps of 1 $\mu$m with 5 $\mu$m between channels This produces a strongly nonuniform spatial gain distribution across the array. To make the array, four layers were grown on a $n^+$GaAs substrate 10 (Si doped, $2 \times 10^{18}$ cm$^{-3}$) using conventional liquid phase epitaxy (LPE). The composition and thickness of the layers are as follows: n Ga$_{0.6}$Al$_{0.4}$As lower claddng layer 11 (2.0$\mu$ thick), Sn doped, $2 \times 10^{16}$ cm$^{-3}$; undoped GaAs active region 12 (0.15$\mu$ thick); p Ga$_{0.6}$Al$_{0.4}$As upper cladding layer 13 (1.8$\mu$ thick), Ge doped, $3 \times 10_{17}$ cm$^{-3}$; p$^+$GaAs cap layer 14, (0.2$\mu$ thick), Ge doped, $8 \times 10^{18}$ cm$^{-3}$. Immediately after growth a single contact 15 of Cr/Au is deposited to form the p contact. Thick photoresist is patterned to define the array, and protons were implanted to define the laser channels. The energy of the proton implantation was chosen to create signifigant spacing between the bottom of the proton damaged regions 16 and the active layer 12. Various proton implant energies were used to demonstrate the importance of strong interchannel coupling (i.e., gain) for achieving single-lobed farfield operation. After implantation, the photoresist was removed, the devices were lapped to $\sim 75$ $\mu$m, AuGe/Au was deposited to form the n contact, and the contacts were annealed at 380° C. for 20 seconds in an H$_2$ atmosphere. Devices were then cleaved into bars $\sim 205$ $\mu$m long and tested under low duty cycle pulsed conditions.

An important parameter necessary for the present invention is control of the degree of interchannel coupling. In a gain-guided laser, this is often the same as the interchannel gain. The degree of interchannel coupling may be increased by either decreasing the optical absorbtion coefficient of the interchannel region and/or decreasing the volume of the lossy interchannel regions. This may be achieved, for example, by decreasing the proton implantation depth (i.e., energy), by increasing the thickness of the upper cladding layer 13, by decreasing the interchannel thickness, by electrical or optical pumping of part or all of the interchannel regions, by operation below threshold of an interchannel laser, or by some other means. For example, consider the effect of lowering the proton implant energy, which increases the distance between the bottom of the proton damaged regions 16 and the active layer 12. Since the proton penetration depth does not extend to the active layer, carriers will diffuse into the regions between the laser channels, thus increasing the interchannel coupling (gain). It is therefore possible to vary the interchannel coupling from its minimum value (deep implant, minimum interchannel gain) to a maximum value (shallow implant, maximum interchannel gain which is determined by the envelope function for the spatial gain distribution).

Figure 4:
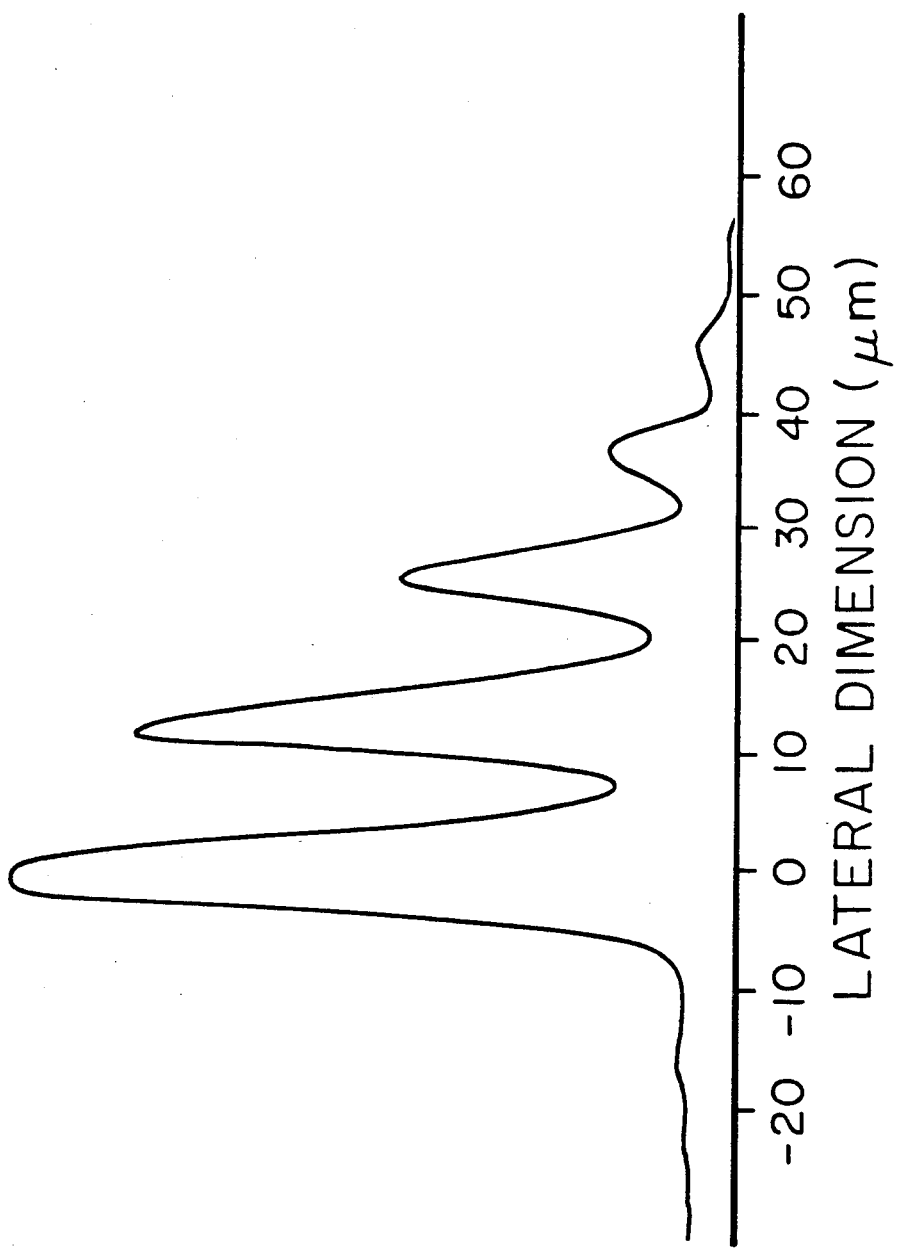
FIG. 4 shows the nearfield spontaneous emission pattern in a deeply implanted array of FIG. 2 just below threshold. The proton damaged region stopped about 0.3 $\mu$m above the active region. The considerably greater intensity under the wider stripes indicates that the gain is greater there than it is under the narrower stripes, thus making visible the nonuniform gain profile across the array. The weak interchannel coupling due to the deep implant is evidenced by the high modulation of the nearfield pattern which results from the well isolated lasers.

FIG. 4 shows the nearfield spontaneous emission pattern in a deeply implanted (150 keV) array of FIG. 3 just below threshold. The proton damaged regions 16 stopped about 0.3 $\mu$m above the active region 12. The considerable greater intensity under the wider stripes indicates that the gain is greater there than it is under the narrower stripes, thus making visible the nonuniform gain profile across the array. The weak interchannel coupling due to the deep implant is evidenced by the large modulation of the nearfield pattern which results from the well isolated lasers.

Figure 5:
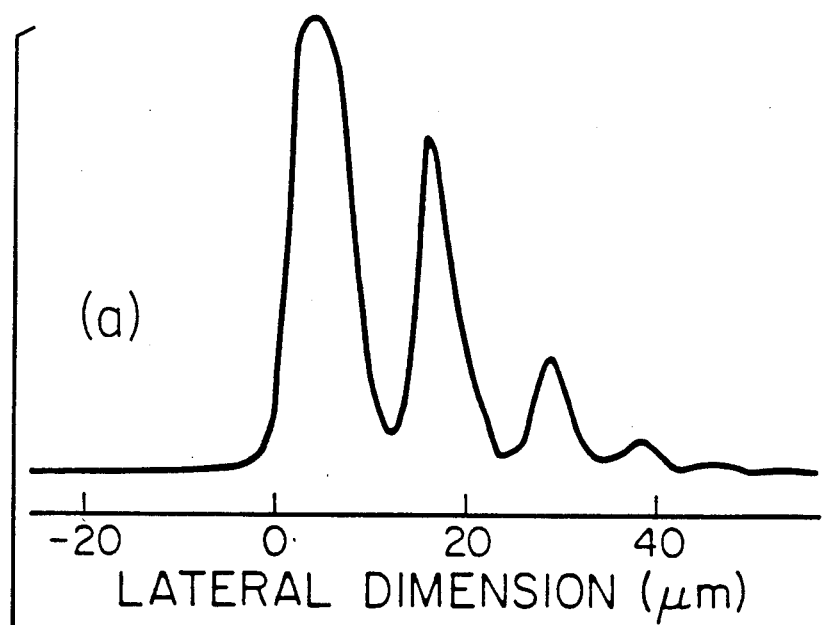
FIG. 5 is a plot of the nearfield pattern (plot a) and farfield pattern (plot b) at threshold of the deeply implanted array of FIG. 4. Note that the farfield pattern of a tailored gain chirped array with weak interchannel coupling is both very broad and multilobed, and hence unusable.
Figure 5:
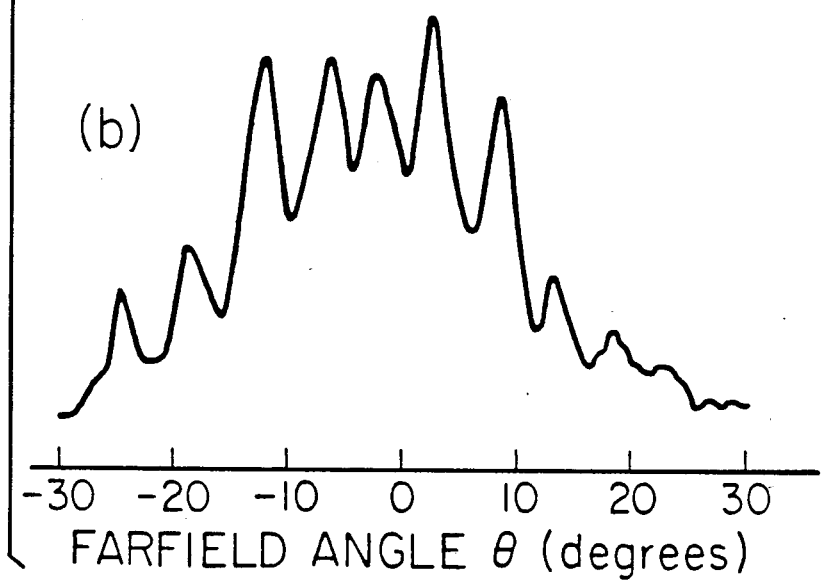

FIG. 5 is a plot of the experimental nearfield pattern (plot a) and farfield pattern (plot b) at threshold of the deeply implanted array of FIG. 4. Note that the individual laser channels are well defined as a result of the deep implantation, and that the farfield pattern is both very broad and multilobed, and hence unusable. The plots of FIG. 5 clearly demonstrate that merely chirping the widths of the laser channels is not sufficient to insure single-lobed operation. This is because of the insufficient interchannel coupling caused by the deep implantation which extends almost down to the active layer.

The desired single-lobed farfield patterns may be achieved by sufficiently increasing the interchannel coupling. Increasing the interchannel coupling has two desirable effects. First, it promotes the tendency of the array to operate in the phase-locked mode. In a phase-locked array, the optical fields of the individual lasers add coherently, with the result that the beamwidth is inversely proportional to the width of the entire array. This beamwidth is many times narrower than that of an array which is not phase-locked. E. Kapon, J. Katz, C. Lindsey, S. Margalit, and A. Yariv have confirmed the importance of strong interchannel coupling for achieving phase-locking of semiconductor laser arrays in their paper "Control of mutual phase locking of monolithically integrated semiconductor lasers", Appl. Phys. Lett., 43(5), Sept. 1, 1983, where they used a laser located in an interchannel region and operated below threshold to vary the interchannel coupling.

Secondly, since the farfield pattern of the array is given by the Fourier transform of the device's nearfield pattern, and the power radiated into the central lobe is proportional to the Fourier coefficient with zero spatial frequency (i.e., the DC term), it is clearly desirable to make the nearfield pattern of the array as uniform as possible. This may also be achieved by strongly coupling the array elements. This second point is illustrated in the theoretical waveguide model of FIG. 6 which is used to predict the theoretical intensity nearfield and farfield patterns of the fundamental $\nu=1$ lateral supermode in a deeply implanted (FIG. 6a) and a shallowly implanted (FIG. 6b) tailored gain chirped array 60 $\mu$m wide. The laser channel widths varied from 5 $\mu$m to 8 $\mu$m in steps of 0.5 $\mu$m. The interchannel thickness was 2.5 $\mu$m. These dimensions correspond to the device shown schematically in FIG. 7a. The net gain at the left edge of the laser was taken as 10 cm$^{-1}$ (just above transparency). The high gain value at the right edge of the laser is fixed by the requirement that at threshold the modal gain of the lasing supermode must equal the mirror losses, which were estimated to be 35 cm$^{-1}$. The absorbtion of the unpumped GaAs active region was estimated to be $-100$ cm$^{-1}$. The effect of the carriers on the real part of the refractive index was included by setting the antiguiding factor equal to 3.0. The eigenmodes and unsaturated modal gains were obtained by numerical solutions of Maxwell's equations.

Figure 6:
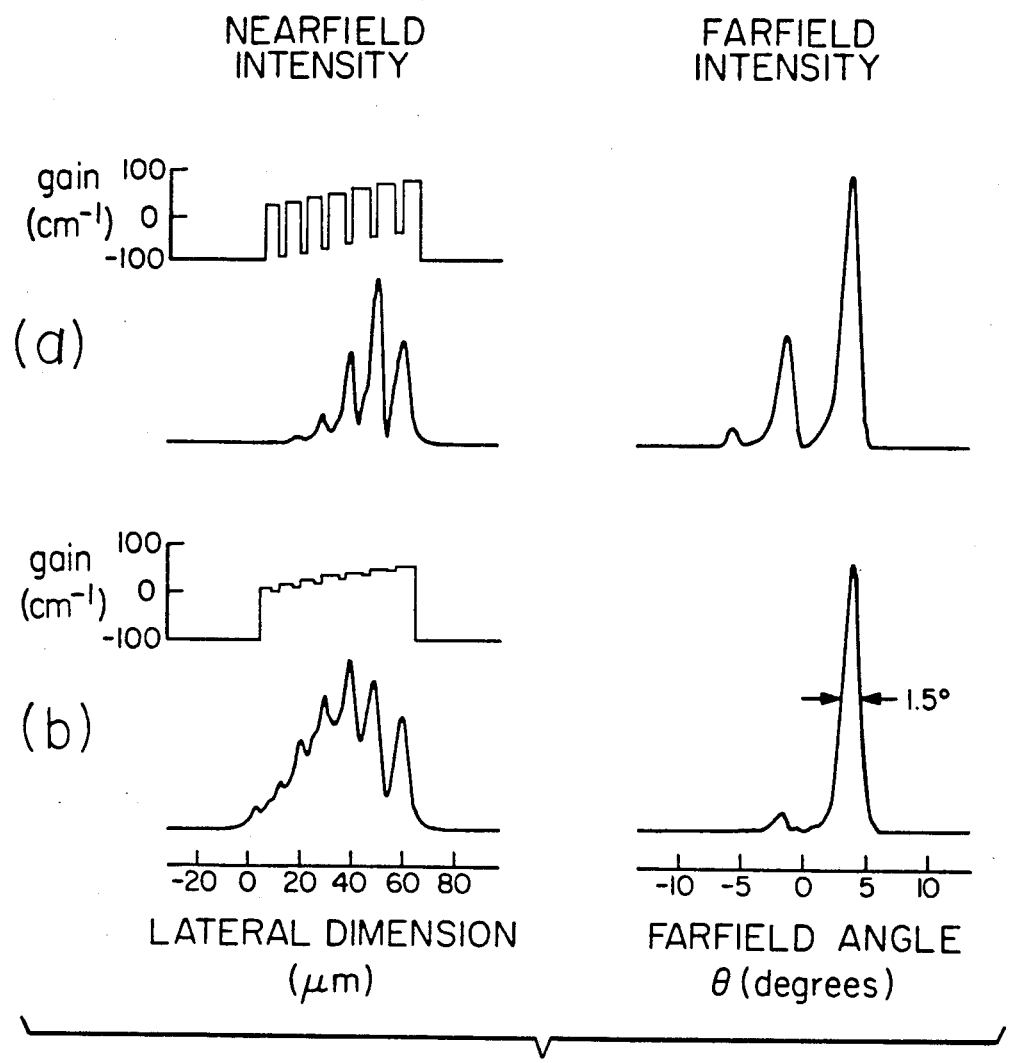
FIG. 6 shows the theoretical effect of interchannel coupling on the nearfield and farfield pattern of nonuniform gain induced waveguides. Graphs a is of a deeply implanted tailored gain chirped array. Graphs b is of a shallowly implanted tailored gain chirped array. The graphs show that in a tailored gain chirped array, it is necessary to have strong interchannel coupling to achieve the desired single-lobed farfield pattern.

FIG. 6 demonstrates how decreasing the depth of the proton implantation decreases the spatial modulation of the nearfield pattern, with the result that the farfield pattern becomes increasingly single-lobed. FIG. 6a shows that a tailored gain chirped array with well defined individual laser channels (i.e., deeply implanted with weak interchannel coupling) will not have a single-lobed farfield pattern. On the other hand, as is illustrated in FIG. 6b, in a device in which the interchannel coupling (i.e., gain) has been sufficiently increased by allowing carrier diffusion to nearly wash out the identity of the individual laser channels will have a single-lobed farfield pattern 1.5° wide. The conclusion that the nearfield intensity must be made as uniform as possible to promote single-lobed operation also applies to a real index guided array.

Therefore, to achieve single-lobed operation in a tailored gain chirped semiconductor laser array, three conditions must be fulfilled. First, the fundamental supermode must be spatially segregated from the other supermodes. Second, the gain profile must be tailored so as to favor the fundamental supermode. Finally, the interchannel coupling must be sufficiently increased so as to bring about single-lobed operation. These conditions will be satisfied in a shallowly implanted tailored gain chirped array. FIG. 7a shows such a shallowly implanted tailored gain chirped array with strong interchannel coupling. The proton implantation energy of 80 keV has been chosen so as to enhance interchannel carrier diffusion by allowing about 1 $\mu$m between the bottom of the resistive proton damaged regions and the active region. The laser channel widths varied from 5 $\mu$m to 8 $\mu$m in steps of 0.5 $\mu$m. These dimensions correspond to the model of FIG. 6. Coupling of the elements has also been enhanced by decreasing the thickness of the interchannel regions from 5 $\mu$m to 2.5 $\mu$m. The molecular beam epitaly (MBE) grown layers were grown as similarly as possible to those of FIG. 3.

FIG. 7b shows the shallowly implanted device of FIG. 7a's spontaneous emission pattern just below threshold, thereby illustrating the tailored gain chirped array's highly nonuniform lateral gain profile. Unlike the deeply implanted array with a multi-lobed farfield pattern of FIG. 5 in which the nearfield pattern shows well defined laser channels, the shallowly implanted array of FIG. 7 does not show well defined laser channels due to the strong interchannel coupling. Comparison of FIGS. 5 and 7 shows that chirping the widths of the proton implanted lasers serves merely as means of spatially separating the supermodes and achieving gain tailoring, while the shallow proton implantation is necessary to bring about the strong interchannel coupling necessary for single lobed farfield operation.

Figure 8:
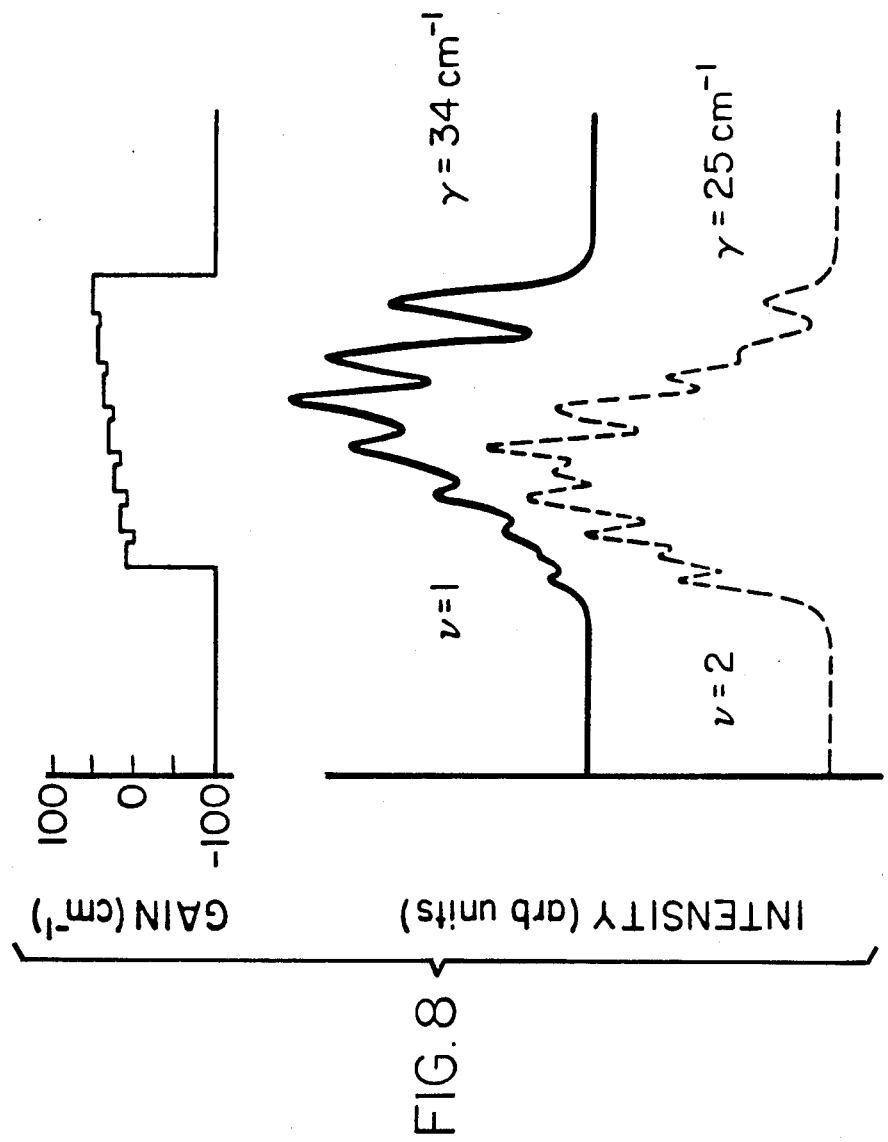
FIG. 8 illustrates the theoretical nearfield intensity patterns of the two supermodes with the highest modal gains for the waveguide model of the device of FIG. 6b and FIG. 7 having the gain profile shown. The graphs of intensity, along with the difference of 9 cm$^{-1}$ in the modal gains $\gamma$, show the strong discrimination in favor of the fundamental supermode.

FIG. 8 presents the theoretical nearfield patterns of the two supermodes with the highest modal gains for the waveguide model of the device of FIG. 6b and FIG. 7. This figure shows that all three criteria for achieving single lobed operation of a tailored gain chirped array have been met. First, the fundamental $\nu=1$ supermode is spatially segregated in the high gain region from the $\nu=2$ (and indeed, all other supermodes). Second, the excellent mode discrimination in favor of the fundamental supermode is evidenced by the 9 cm$^{-1}$ difference in the modal gains $\gamma$ between the fundamental and its closest competition. Finally, FIGS. 6b,7,8, and 9 show that the interchannel coupling is sufficient to achieve single-lobed operation.

FIG. 9 shows experimental farfield patterns for the shallowly implanted nonuniform tailored gain chirped array of FIG. 7. FIG. 9a demonstrates 1.5° wide diffraction limited fundamental supermode operation at 1.3 $I_{th}$. FIG. 9b demonstrates high power operation with 200 mW of optical power emitted per mirror into 2.5° at 2.9 $I_{th}$. 450 milliwatts is emitted into a slightly broader single-lobed beam 3.3° wide at 5.3 $I_{th}$. The slight broadening of the beamwidth with power is in excellent agreement with the theoretical predictions of C. P. Lindsey, E. Kapon, J. Katz, S. Margalit, and A. Yariv in their paper "Single contact tailored gain phased-array array of semiconductor lasers", Appl. Phys. Lett., 45(7) Oct. 1, 1984.

Note that the agreement between the calculated farfield patterns of FIG. 6b and the experimental results of FIG. 9a is quite good. Extensive analysis shows the important result that although the nearfield patterns of single contact tailored gain chirped arrays are very sensitive to changes in the parameters comprising the theoretical models, the single-lobed nature of the farfields are much less sensitive to parameter variations as long as there is a nonuniform gain profile which achieves sufficient spatial segregation of the fundamental mode from all other supermodes, sufficient gain tailoring to favor the fundamental supermode, and sufficient interchannel coupling to achieve single-lobed farfield operation.

Finally, while the invention detailed here is an asymmetric, nonuniform single contact tailored gain chirped array, it is but a simple extension of these results to make the symmetric version this device in which the channel widths increase from a minimum to a maximum in the center and then to a minimum. (E. Kapon, C. P. Lindsey, J. S. Smith, S. Margalit, and A. Yariv, "Inverted-V chirped phase-arrays of gain-guided GaAs/GaAlAs diode lasers", Appl. Phys. Lett., 45(12), Dec. 15, 1984.) The symmetric version of the invention has been demonstrated to also have a single-lobed farfield pattern which is, however, directed normal (at 0°) to the mirror facets.

Although preferred embodiments of the invention have been described and illustrated herein, it is recognized that modifications and equivalents in different structures may readily occur to those skilled in the art of laser arrays. What is necessary and sufficient in each array structure is to (1) provide for a means of spatially segregating the fundamental supermode from the other supermodes by means of a nonuniform array structure, (2) provide for a means of tailoring the spatial gain profile so as to favor the fundamental supermode in such a structure, and (3) provide for a means of increasing the interchannel coupling so as to bring about single-lobed farfield operation in such a structure.

What is claimed is:

1. In a phase-locked array of diode laser channels fabricated in a body of semiconductor material cleaved at opposite ends to provide facet mirrors which form resonant cavities in said channels, and having a contact for current injection into each channel along at least a majority of its entire length, the improvement of supermode control for a single-lobed farfield pattern comprising means for spatially segregating the supermodes of said array to concentrate the fundamental supermode at one part of the array, means for tailoring the spatial gain profile so as to favor the fundamental supermode, and means for increasing interchannel coupling sufficiently to bring about a single-lobed farfield pattern, wherein said means for spatially segregating the fundamental supermode from the other supermodes is comprised of said channels being nonuniform in width.

2. An improvement in an array of diode laser channels as defined in claim 1 wherein said nonuniformity for spatially segregating the fundamental supermode from the other supermodes consists of said channels varying in width from a minimum at one side to a maximum at the other side of said array.

3. An improvement in an array of diode laser channels as defined in claim 1 wherein said nonuniformity for spatially segregating the fundamental supermode from the other supermodes consists of said channels varying in width from a minimum at one side to a maximum in the center and then to a minimum at the other side of said array.

4. An improvement in an array of diode laser channels as defined in claim 1 wherein said nonuniformity for spatially segregating the fundamental supermode from the other supermodes consists of said channels varying in width from a maximum at one side to a minimum in the center and then to a maximum at the other side of said array.

5. An improvement in an array of diode laser channels as defined in claim 1 wherein said means for tailoring the spatial gain profile is comprised of said channels of nonuniform width having injection contacts which vary in width with the widths of the channels.

6. An improvement in an array of diode laser channels as defined in claim 5 wherein said means for tailoring the spatial gain profile is comprised of said channels being nonuniform in width from a minimum at one side to a maximum at the other side of said array.

7. An improvement in an array of diode laser channels as defined in claim 5 wherein said means for tailoring the spatial gain profile is comprised of said channel being nonuniform in width from a minimum at one side to a maximum in the center and then to a minimum at the other side of said array.

8. An improvement in an array of diode laser channels as defined in claim 5 wherein said means for tailoring the spatial gain profile is comprised of said channels being nonuniform in width of each channel from a maximum at one side to a minimum in the center and then to a maximum at the other side of said array.

9. An improvement in an array of diode laser channels as defined in claim 1 wherein said means for increasing the interchannel coupling is comprised of means for decreasing the optical absorption coefficient in the interchannel regions.

10. An improvement in an array of diode laser channels as defined in claim 9 wherein said means for decreasing the optical absorption coefficient in the interchannel regions is comprised of proton implantation sufficient to bring about single-lobed farfield operation.

11. An improvement in an array of diode laser channels as defined in claim 1 wherein said means for increasing the interchannel coupling is comprised of a decrease in the volume of absorbing material in the interchannel regions.

12. An improvement in an array of diode laser channels as defined in claim 11 wherein said means for decreasing the volume of absorbing material in the interchannel regions is comprised of a decrease in the width of the interchannel regions.

* * * * *